(12) United States Patent
Pust (10) Patent No.: US 10,910,527 B2
(45) Date of Patent: Feb. 2, 2021

(54) OPTOELECTRONIC COMPONENT

(71) Applicant: OSRAM Opto Semiconductors GmbH, Regensburg (DE)

(72) Inventor: Philipp Pust, Langquaid (DE)

(73) Assignee: OSRAM OLED GMBH, Regensburg (DE)

(*) Notice: Subject to any disclaimer, the term of this patent is extended or adjusted under 35 U.S.C. 154(b) by 0 days.

(21) Appl. No.: 16/349,241

(22) PCT Filed: Dec. 6, 2017

(86) PCT No.: PCT/EP2017/081698
§ 371 (c)(1),
(2) Date: May 10, 2019

(87) PCT Pub. No.: WO2018/104389
PCT Pub. Date: Jun. 14, 2018

(65) Prior Publication Data
US 2019/0280169 A1    Sep. 12, 2019

(30) Foreign Application Priority Data
Dec. 9, 2016    (DE) ......................... 10 2016 123 971

(51) Int. Cl.
*H01L 33/50* (2010.01)
*F21K 9/64* (2016.01)
(Continued)

(52) U.S. Cl.
CPC ........ *H01L 33/504* (2013.01); *C09K 11/0883* (2013.01); *C09K 11/57* (2013.01);
(Continued)

(58) Field of Classification Search
CPC ..... H01L 33/504; C09K 11/57; C09K 11/617; C09K 11/616; C09K 11/7734; C09K 11/0883; F21K 9/64; F21Y 2115/10
See application file for complete search history.

(56) References Cited

U.S. PATENT DOCUMENTS 10,170,453 B2    1/2019  Stoll et al.
2015/0295144 A1  10/2015 Weiler et al.
(Continued)

FOREIGN PATENT DOCUMENTS

DE    102015105897 A1    10/2016
DE    102015107580 A1    11/2016
(Continued)

OTHER PUBLICATIONS

Pust, P. et al., "Narrow-band red-emitting Sr[LiAl3N4]: Eu2+ as a next-generation LED-phosphor material," Nature Materials, vol. 13, www.nature.com/naturematerials, Sep. 2014, 6 pages.

*Primary Examiner* — Joseph L Williams
*Assistant Examiner* — Jose M Diaz
(74) *Attorney, Agent, or Firm* — Slater Matsil, LLP (57) ABSTRACT

An optoelectronic component is disclosed. In an embodiment, an optoelectronic component includes a semiconductor chip configured to emit primary radiation having a peak wavelength between 420 nm inclusive and 480 nm inclusive and a conversion element including a first converter material configured to partially convert the primary radiation into secondary radiation in a green range of the electromagnetic spectrum and a second converter material configured to partially convert the primary radiation into a secondary radiation in a red region of the electromagnetic spectrum, wherein the second converter material including a first red phosphor of the formula $(K,Na)_2(Si,Ti)F_6:Mn^{4+}$ and a second red phosphor of the formula $(M')_{2-x}Eu_xSi_2Al_2N_6$ where (Continued)

M'=Sr, Ca, Ba, and/or Mg and $0.001 \leq x' \leq 0.2$, and wherein the optoelectronic device is configured to emit white total radiation.

20 Claims, 3 Drawing Sheets

(51) Int. Cl.
    *C09K 11/08*     (2006.01)
    *C09K 11/77*     (2006.01)
    *C09K 11/61*     (2006.01)
    *C09K 11/57*     (2006.01)
    *F21Y 115/10*     (2016.01)

(52) U.S. Cl.
    CPC .......... *C09K 11/616* (2013.01); *C09K 11/617* (2013.01); *C09K 11/7734* (2013.01); *F21K 9/64* (2016.08); *F21Y 2115/10* (2016.08)

(56) References Cited

U.S. PATENT DOCUMENTS

| | | |
|---|---|---|
| 2017/0309795 A1 | 10/2017 | Kim et al. |
| 2017/0335186 A1 | 11/2017 | Moon et al. |
| 2018/0287019 A1* | 10/2018 | Hashimoto ........... H01L 33/504 |
| 2018/0358516 A1 | 12/2018 | Pust et al. |

FOREIGN PATENT DOCUMENTS

| | | |
|---|---|---|
| DE | 102015119817 A1 | 5/2017 |
| EP | 3206240 A1 | 8/2017 |
| WO | 2014202464 A1 | 12/2014 |
| WO | 2016056837 A1 | 4/2016 |
| WO | 2016093626 A1 | 6/2016 |

* cited by examiner

OPTOELECTRONIC COMPONENT

This patent application is a national phase filing under section 371 of PCT/EP2017/081698, filed Dec. 6, 2017, which claims the priority of German patent application 102016123971.2, filed Dec. 9, 2016, each of which is incorporated herein by reference in its entirety.

TECHNICAL FIELD

The invention relates an optoelectronic device.

BACKGROUND

Optoelectronic devices such as light-emitting diodes (LEDs), which emit a white radiation, are used, for example, in televisions, tablets, smartphones and computers to backlight LCD filter systems. There are different requirements for the LED. Two essential aspects are the maximum brightness on the one hand and the coverage of a large color space on the other hand. The conventional LCD filter systems consist of three or four color filters (blue, green and red or blue, green, yellow and red). The LCD filters can have a minimum spectral or "transmission" half width (FWHM, full width at half maximum) in the range of typically 70 to 120 nm, in which the transmission can be electrically controlled. The transmission results from the superposition of the three color filters, resulting in areas of the visible spectrum in which no complete transmission is achieved. As a result, with a broadband spectrum of LED backlighting the color filters, a portion of the emitted light is absorbed by the filter. In order to obtain the maximum amount of light from the LED when the LCD color filters are fully open at the screen level, narrow-band conversion or phosphors are required which emit in the area of the individual filter curves in order to minimize the portion of light absorbed. In order to achieve a high color saturation, it is important that the individual emissions of the LED spectrally address only one of the color filters of the system. In this way, more saturated colors (red, green and blue) and thus larger color spaces can be achieved after filtering.

To generate white light using an LED, a semiconductor chip that emits narrow-band blue light is usually used. Portions of this blue light are converted into red and green light by phosphors, so that altogether white light results. As a red emitting phosphor it is known to use $(K,Na)_2(Si,Ti)F_6:Mn^{4+}$ which has a narrow band emission spectrum. The disadvantage of this solution is that $(K,Na)_2(Si,Ti)F_6:Mn^{4+}$ has a low refractive index and a relatively low absorption capacity for primary radiation, which requires large amounts of material. In addition, the phosphor has long decay times of 5 to 10 ms. The latter leads to additional display functions, such as the so-called local dimming, by the afterglow of the phosphor leads to color location shifts.

Another known solution for obtaining a narrow-band LED spectrum consisting of blue, green and red portions is to use three different colored semiconductor chips in one LED, this means without phosphor conversion. A major disadvantage of this concept is that the red InGaAlP chip used here shows strong brightness losses above the temperature, whereby the color location of the entire LED varies greatly. Thus, a complex and expensive driver electronic is required to counteract this. In addition, three chips instead of one must be electrically controlled. These solutions are mainly used for directly emitting displays (a LED corresponds to a pixel), so without color filters and LCD, and are only conditionally suitable for LCD displays.

Another possibility is the use of a blue semiconductor chip whose light is partly converted into green light by means of a phosphor and a red semiconductor chip in an LED package.

SUMMARY OF THE INVENTION

Embodiments provide an optoelectronic device which has an increased color location stability compared to the state of the art and a coverage of a large color space. Further embodiments provide an optoelectronic device for backlighting color filter systems and a lighting unit comprising an optoelectronic device.

In various embodiments an optoelectronic device is specified.

The optoelectronic device comprises a semiconductor chip and a conversion element. The semiconductor chip is configured to emit primary radiation with a peak wavelength between 420 nm inclusive and 480 nm inclusive during operation of the device.

Peak wavelength is here and in the following the wavelength of a peak at which the maximum intensity of the peak lies.

According to at least one embodiment, the conversion element comprises a first converter material configured to at least partially convert the primary radiation into a secondary radiation in the green region of the electromagnetic spectrum.

According to at least one embodiment, the conversion element comprises a second converter material configured to partially convert the primary radiation into a secondary radiation in the red region of the electromagnetic spectrum.

According to at least one embodiment, the second converter material comprises a first red phosphor of the formula $(K,Na)_2(Si,Ti)F_6:Mn^{4+}$ and a second red phosphor of the formula $(M')_{2-x'}Eu_{x'}Si_2Al_2N_6$ where M'=Sr, Ca, Ba, and/or Mg and $0.001 \leq x' \leq 0.2$, particular $[Sr(Sr_aM_{1-a})]_{1-x}Eu_xSi_2Al_2N_6$ where M=Ca, Ba, Zn and/or Mg, $0.5 \leq a \leq 1$ and $0.001 \leq x \leq 0.2$, $(M'')_{1-x''}Eu_{x''}AlSiN_3 * Si_2N_2O$ with M''=Sr, Ca, Ba, and/or Mg and $0.001 \leq x'' \leq 0.2$, $(M''')_{2-2x'''}Eu_{2x'''}Si_5N_8$ where M'''=Sr, Ca, Ba, and/or Mg and $0.001 \leq x''' \leq 0.2$, or $(M'''')_{1-x''''}Eu_{x''''}[LiAl_3N_4]$ with M''''=Sr, Ca, Ba, and/or Mg and $0.001 \leq x'''' \leq 0.2$.

The second converter material can also consist of the first red phosphor and the second red phosphor.

Due to the combination of at least two red phosphors of the second converter material, on the one hand the aging-related color stability of the optoelectronic device can be improved; on the other hand, the high phosphor fill quantity can be reduced due to the low absorption of the first red phosphor $(K,Na)_2(Si,Ti)F_6:Mn^{4+}$. The disadvantages associated with the exclusive use of the red phosphor $(K,Na)_2(Si,Ti)F_6:Mn^{4+}$ as red converter material can thus be compensated or largely compensated by the use of two red phosphors.

Advantageously, the second red phosphors have a short decay time, for example, a decay time between 1 and 20 μsec, so that the color location shift can be reduced for functions such as "local dimming". In local dimming, individual optoelectronic devices, for example, light-emitting diodes, are switched on and off at a high frequency in a display or their luminosity is regulated to increase contrast. Due to the short decay times of the second red phosphors, it is advantageous that afterglow does not occur during the high-frequency switching on and off of the light-emitting diodes and the associated color location shifts. The inventive optoelectronic device is therefore particularly suitable for backlighting displays, especially LCD displays, with local dimming functions.

According to at least one embodiment, the second converter material comprises a first red phosphor of the formula $K_2SiF_6:Mn^{4+}$.

According to one embodiment, the second red phosphors exhibit a secondary radiation with a spectrally narrow-band emission, for example, with a full width at half maximum (FWHM) of less than 90, preferably less than 80, particularly preferred less than 70 nm. Thus, the emission peaks of the second phosphors show in particular a very large overlap with the transmission range of a standard red filter, so that only little light is lost and the achievable color space is large. In addition, the secondary radiation of the very narrow-band emitting first red phosphor $(K,Na)_2(Si,Ti)F_6:Mn^{4+}$ is also within the transmission range of a standard red filter, so that the achievable color space is increased again with advantage. By using the first and second red phosphors as the second converter material, a particularly large color space can be covered.

According to at least one embodiment, the second red phosphor has the formula $(M')_{2-x}Eu_xSi_2Al_2N_6$ with M'=Sr and/or Ca and $0.001 \leq x' \leq 0.2$, preferably $0.01 \leq x \leq 0.1$. Particularly preferred the second red phosphor has the formula $[Sr(Sr_aM_{1-a})]_{1-x}Eu_xSi_2Al_2N_6$, with M=Ca, $0.5 \leq a \leq 1$, preferably $0.7 \leq a < 1$, particularly preferred $0.8 \leq a < 1$, and $0.001 \leq x \leq 0.2$, preferably $0.01 \leq x \leq 0.1$. The second red phosphor of the formula $[Sr(Sr_aM_{1-a})]_{1-x}Eu_xSi_2Al_2N_6$ crystallizes especially in the space group P1, P2, P2$_1$ or P$\bar{1}$, particularly preferred in the space group P2$_1$. The half-width for $[Sr(Sr_aM_{1-a})]_{1-x}Eu_xSi_2Al_2N_6$, for example, is about 80 nm.

According to at least one embodiment, the red phosphor has the formula $(M'')_{1-x''}Eu_{x''}AlSiN_3*Si_2N_2O$ with M''=Sr and/or Ca and $0.001 \leq x'' \leq 0.2$, preferably $0.01 \leq x \leq 0.1$. The half-width for $(M'')_{1-x''}Eu_{x''}AlSiN_3*Si_2N_2O$, for example, is below 90 nm.

According to at least one embodiment, the second red phosphor has the formula $(M''')_{2-2x'''}Eu_{2x'''}Si_5N_8$ with M'''=Sr, Ca and/or Ba and $0.001 \leq x''' \leq 0.2$, preferably $0.01 \leq x \leq 0.1$.

According to at least one embodiment, the second red phosphor has the formula $(M'''')_{1-x''''}Eu_{x''''}[LiAl_3N_4]$ with M''''=Sr and/or Ca and $0.001 \leq x'''' \leq 0.2$, preferably $0.01 \leq x$ 0.1. The half-width for $(M'''')_{1-x''''}Eu_{x''''}[LiAl_3N_4]$ is preferably below 60 nm, for example, at about 50 nm.

The dominant wavelengths of the second red phosphors, for example, are in the range from 590 nm to 640 nm when excited with a primary radiation of a peak wavelength of 460 nm.

The dominant wavelength is a way of describing non-spectral (polychromatic) light mixtures by spectral (monochromatic) light, which produces a similar color perception. In the CIE color space, the line connecting a point for a specific color and the point Cx=0.333, Cy=0.333 can be extrapolated to meet the outline of the space at two points. The intersection point, which is closer to said color, represents the dominance wavelength of the color as the wavelength of the pure spectral color at that intersection point. The dominant wavelength is therefore the wavelength perceived by the human eye.

The dominance wavelengths of the second red phosphors can be, according to an embodiment, in the range from 595 nm to 625 nm for $(M')_{2-x}Si_2Al_2N_6$, preferably $[Sr(Sr_aM_{1-a})]_{1-x}Eu_xSi_2Al_2N_6$, particularly preferred $[Sr(Sr_aCa_{1-a})]_{1-x}Eu_xSi_2Al_2N_6$, or $(M'')_{1-x''}Eu_{x''}AlSiN_3*Si_2N_2O$, preferably $(Sr,Ca)_{1-x''}Eu_{x''}AlSiN_3*Si_2N_2O$.

The dominant wavelengths of the second red phosphors can be in the range of 623 nm to 633 nm for the second red phosphors $(M'''')_{1-x''''}Eu_{x''''}[LiAl_3N_4]$, preferably $(Sr,Ca)_{1-x''''}Eu_{x''''}[LiAl_3N_4]$, according to an embodiment.

The dominant wavelengths of the second red phosphors can be in the range of 590 nm to 610 nm for the second red phosphors $(M''')_{2-2x'''}Eu_{2x'''}Si_5N_8$, preferably $(Ca,Ba,Sr)_{2-x'''}Eu_{2x'''}Si_5N_8$, according to an embodiment.

The color locations of the second red phosphors, for example, are in the range of Cx=0.595-0.625; Cy=0.370-0.400 or in the range of Cx=0.655-0.685; Cy=0.300-0.350 or in the range of Cx=0.620-0.655; Cy=0.340-0.370 for the second red phosphors $(M')_{2-x}Eu_xSi_2Al_2N_6$, preferably $[Sr(Sr_aM_{1-a})]_{1-x}Eu_xSi_2Al_2N_6$, particularly preferred $[Sr(Sr_aCa_{1-a})]_{1-x}Eu_xSi_2Al_2N_6$, or $(M'')_{1-x''}Eu_{x''}AlSiN_3*Si_2N_2O$, preferably $(Sr,Ca)_{1-x''}Eu_{x''}AlSiN_3*Si_2N_2O$ when excited with a primary radiation of a peak wavelength of 460 nm. The Cx and Cy values mentioned here and below refer preferably to the 1931 CIE standard color chart.

The color locations of the second red phosphors, for example, are in the range of Cx=0.680-0.715; Cy=0.280-0.320 for the second red phosphors $(M'''')_{1-x''''}Eu_{x''''}[LiAl_3N_4]$, preferably $(Sr,Ca)_{1-x''''}Eu_{x''''}[LiAl_3N_4]$ when excited with a primary radiation of a peak wavelength of 460 nm.

The color location of the second red phosphors, for example, are in the range of Cx=0.610-0.650; Cy=0.340-0.380 for the second red phosphor $(M''')_{2-2x'''}Eu_{2x'''}Si_5N_8$, preferably $(Ca,Ba,Sr)_{2-2x'''}Eu_{2x'''}Si_5N_8$ when excited with a primary radiation of a peak wavelength of 460 nm.

The dominant wavelength of the first red phosphor $(K,Na)_2(Si,Ti)F_6:Mn^{4+}$, preferably $K_2SiF_6:Mn^{4+}$, is, for example, in the range of 610-630 nm when excited with a primary radiation of a peak wavelength of 460 nm. The dominant wavelength of the first red phosphor $(K,Na)_2(Si,Ti)F_6:Mn^{4+}$ is preferably in the range of 617-624 nm. The color location of the first red phosphor, for example, is in the range of Cx=0.680-0.710; Cy=0.290-0.330 when excited with a primary radiation of a peak wavelength of 460 nm.

The dominant wavelength of the first red phosphor is shorter than the dominant wavelength of the second red phosphor according to at least one embodiment. The dominant wavelength of the first red phosphor is thus closer to the maximum eye sensitivity at 555 nm compared to the dominant wavelength of the second red phosphor, whereby the emitted radiation has a higher overlap with the eye sensitivity curve and is therefore perceived as brighter. In total, the device emits a total radiation that is perceived as brighter than the total radiation of a device that contains only the second red phosphor as a red phosphor.

Due to the narrow-band emission in combination with the mentioned dominance wavelengths of the first red phosphor and the second red phosphors, these emit no or only a small amount of radiation outside the visible spectral range. This means that all or almost all emitted photons are within the sensitivity range of the human eye, which excludes or minimizes efficiency losses due to emission in the invisible range of the electromagnetic spectrum. This results in a high luminescence efficiency.

According to at least one embodiment, the peak wavelength of the secondary radiation of the first converter material lies in a range from 500 to 600 nm, preferably in a range from 510 to 580 nm, particularly preferred in a range between 520 and 550 nm.

According to at least one embodiment, the first converter material comprises converter particles with a quantum structure with barrier layers and quantum layers or a green phosphor. The first converter material may also consist of converter particles with a quantum structure with barrier layers and quantum layers or a green phosphor.

According to at least one embodiment, the first converter material comprises converter particles having a quantum structure with barrier layers and quantum layers, wherein the barrier layers and quantum layers are arranged alternately. The quantum layers and the barrier layers thus form a multiple quantum well structure. The quantum structure can also consist of the quantum layers and the barrier layers. The quantum layers can also be called quantum pots or quantum troughs and are preferably two-dimensional quantum structures. This means that a thickness of the quantum layers is then much smaller than lateral expansions of the quantum layers. In particular, the converter particles are not quantum dots. Quantum dots are approximately zero-dimensional, in contrast to the two-dimensional quantum structures.

Due to the quantum structure of the converter particles, a spectrally narrow band emission can be achieved, for example, with a full width at half maximum (FWHM) of less than 50 nm, especially in the range of 30 nm, in the green range of the electromagnetic spectrum. The emission peaks of the converter particles thus show a very large overlap with the transmission range of a standard green filter, so that only little light is lost and the achievable color space is large.

According to at least one embodiment, the quantum layers have $In_xGa_{1-x}N$ with $0.1 \leq x \leq 0.5$, preferably $0.2 \leq x \leq 0.4$, or the quantum layers consist of $In_xGa_{1-x}N$ with $0.1 \leq x \leq 0.5$, preferably $0.2 \leq x \leq 0.4$. The quantum layers are responsible for the wavelength of the secondary radiation through their composition. In particular, the indium content determines the wavelength of the secondary radiation. For example, the peak wavelength of the secondary radiation is at $\lambda=490$ nm with an indium content of about 20 mol % in relation to the total amount of gallium and indium, this means $x=0.2$ and a thickness of the quantum layer of 2 nm to 5 nm. The peak wavelength of the secondary radiation, for example, is 580 nm with an indium content of 40 mol % in relation to the total amount of gallium and indium, this means $x=0.2$ and a thickness of the quantum layer of 2 nm to 5 nm.

According to at least one embodiment, the quantum layers shall have a layer thickness from 2.0 nm inclusive to 5 nm inclusive, preferably from 2.0 nm inclusive to 4.0 nm inclusive, particularly preferably from 2.5 nm inclusive to 3.5 nm inclusive. For example, the quantum layers have a layer thickness of 2.9 nm. If the layer thickness of a quantum layer exceeds 5 nm, the internal quantum efficiency decreases. If the layer thickness of a quantum layer is less than 2.0 nm, the band gap increases, thereby shifting the peak wavelength of the secondary radiation to shorter wavelengths and a higher indium content of the quantum layer is necessary to achieve the desired peak wavelength.

According to at least one embodiment, the barrier layers $Al_yGa_{1-y}N$ with $0.0 \leq y \leq 0.5$, preferably $0.0 \leq y \leq 0.4$, particularly preferred $0.0 \leq y \leq 0.3$, very particularly preferred $y=0$ or consist of this material. The barrier layers are particularly preferred to include GaN or consist of GaN.

According to at least one embodiment, the barrier layers shall have a layer thickness from 1.5 nm inclusive to 100 nm inclusive, preferably from 1.5 nm inclusive to 17.5 nm inclusive, for example, 16 nm or 17 nm.

According to at least one embodiment, a barrier layer and a quantum layer each form a double layer. The converter particles preferably have between five and 200 double layers. Depending on the number of double layers, the desired portion of primary radiation incident on the converter particle and converted into secondary radiation can be adapted to the desired requirements. With advantage it makes it very easy to adjust the conversion degree of the converter particles.

A full conversion of the primary radiation can take place if the quantum structure comprises or consists of 120 to 200 double layers. A partial conversion can take place if the quantum structure comprises or consists of five to 120, preferably ten to 50, double layers.

According to at least one embodiment, a double layer shall have a layer thickness from 3.5 nm inclusive to 105 nm inclusive, preferably from 3.5 nm inclusive to 21.5 nm inclusive.

According to at least one embodiment, the converter particles comprise a buffer layer. The buffer layer may consist of $Al_yGa_{1-y}N$ with $0=y \leq 0.5$, preferably $0.0 \leq y \leq 0.4$, particularly preferred $0.0 \leq y \leq 0.3$, very particularly preferred $y=0$ or contain this material. The buffer layer is preferably made of the same material as the barrier layers. The quantum structure is preferably arranged above the buffer layer, whereby a quantum layer is arranged above the buffer layer.

According to at least one embodiment, the quantum structure or the buffer layer and the quantum structure are arranged and/or grown on a substrate. Preferably, the quantum structure or the buffer layer and the quantum structure have grown epitaxially, for example, on a translucent growth substrate such as sapphire.

According to at least one embodiment, the secondary radiation of the converter particles in the green spectral range has a half-width of at least 15 nm or 20 nm or 25 nm. Alternatively, or in addition, this half-value of the secondary radiation of the converter particles shall not exceed 50 nm or 40 nm or 30 nm.

According to at least one embodiment, the first converter material has a green phosphor selected from the group consisting of orthosilicates, nitridoorthosilicates, beta-SiAlONe and garnets, or the first converter material consists of a green phosphor selected from the group consisting of orthosilicates, nitridoorthosilicates, beta-SiAlONe and garnets.

The advantage of these green phosphors for the first converter material is that they have half-widths of less than 90 nm, preferably of less than 70 nm, particularly preferred below 60 nm. The emission peaks of the green phosphors thus show in particular a very large overlap with the transmission range of a standard green filter, so that only little light is lost and the achievable color space is large.

According to at least one embodiment, the first converter material comprises a green orthosilicate phosphor of the formula $(AE)_{2-y}Eu_ySiO_4$ where AE=Sr, Ca, Ba, and/or Mg, preferably AE=Sr and/or Ba, and $0.001 \leq y \leq 0.2$, preferably $0.01 \leq y \leq 0.1$.

According to at least one embodiment, the first converter material comprises a green nitridoorthosilicate phosphor of formula $(AE)_{2-b-y}(RE)_bEu_ySiO_{4-b}N_b$ where AE=Sr, Ba, Ca and/or Mg, RE=Rare Earth Metals, $0.002 \leq y' \leq 0.4$, $0 \leq b < 2-y'$, preferably $b=0$ or $(AE')_x(RE')_{x'}Eu_{y''}Si_{1-d}O_{4-c-2d}N_{2d}N_c$, where AE'=Sr, Ba, Ca and/or Mg, RE'=Rare earth metals, $0.002 \leq y'' \leq 0.4$, $0 \leq c < 2-y''$ preferably $c=0$, and $0 \leq d < 1$.

According to at least one embodiment, the first converter material comprises a green beta-SiAlON phosphor of the formula $Si_{6-z-2y'''}Eu_{y'''}Al_zO_zN_{8-z}$ with $0 \leq z \leq 6$ and $0.001 \leq y''' \leq 0.2$.

According to at least one embodiment, the first converter material comprises a green garnet phosphor of the formula $(Lu,Y,Gd,Tb)_{3-y''''}Ce_{y''''}(Al,Ga)_5O_{12}$, preferably $(Lu,Y)_{3-y''''}Ce_{y''''}(Al,Ga)_5O_{12}$ with $0.003 \leq y'''' \leq 0.6$.

The color locations of the green phosphors, for example, are in the range of $Cx=0.280$-$0.330$; $Cy=0.630$-$0.680$ or $Cx=0.330$-$0.380$; $Cy=0.590$-$0.650$ when excited with a primary radiation of a peak wavelength of 460 nm for the green beta-SiAlON phosphors or the green orthosilicate phosphors of the formula $(AE)_{2-y}Eu_ySiO_4$ where AE=Sr, Ca, Ba, and/or Mg, preferably AE=Sr and/or Ba.

The color location of the green phosphors, for example, are in the range of $Cx=0.340$-$0.380$; $Cy=0.550$-$0.580$ for the green garnet phosphors of the formula $(Lu,Y,Gd,Tb)_{3-y''''}Ce_{y'}(Al,Ga)_5O_{12}$, preferably $(Lu,Y)_{3-y''''}Ce_{y''''}(Al,Ga)_5O_{12}$, when excited with a primary radiation of a peak wavelength of 460 nm.

That a converter material or a phosphor partially converts the primary electromagnetic radiation into secondary electromagnetic radiation means that the primary electromagnetic radiation is partially absorbed by the converter materials or phosphors and emitted as secondary radiation with a wavelength range at least partially different from the primary radiation. In this so-called partial conversion, the optoelectronic device emits a total radiation that is composed of the primary radiation and the secondary radiation or only of the secondary radiation.

According to a preferred embodiment, the device is configured to emit white total radiation during operation. This makes the device particularly suitable for its application in the backlighting of displays, especially LCD displays. Preferably, the white total radiation has a correlated color temperature between 4000 K and 30000 K. For example, the color location of the white total radiation is in the range of $Cx=0.15$-$0.40$ and $Cy=0.15$-$0.40$, preferably $Cx=0.20$-$0.37$ and $Cy=0.20$-$0.37$.

According to at least one embodiment, the semiconductor chip is a layer sequence with an active layer that is configured to emit primary electromagnetic radiation during operation of the illumination device.

In this context, "layer sequence" means a layer sequence comprising more than one layer, for example, a sequence of a p-doped and an n-doped semiconductor layer, wherein the layers are arranged one above the other and wherein at least one active layer emitting electromagnetic primary radiation is contained.

The layer sequence can be configured as an epitaxial layer sequence or as a radiation-emitting semiconductor chip with an epitaxial layer sequence, so as an epitaxially grown semiconductor layer sequence. The layer sequence can be executed on the basis of InGaAlN, for example. InGaAlN-based semiconductor chips and semiconductor layer sequences are in particular those in which the epitaxially produced semiconductor layer sequence has a layer sequence of different individual layers which contains at least one individual layer which has a material from the III-V compound semiconductor material system $In_xAl_yGa_{1-x-y}N$ with $0 \leq x \leq 1$, $0 \leq y \leq 1$ and $x+y \leq 1$. Semiconductor layer sequences that have at least one active layer based on InGaAlN can emit electromagnetic radiation in a blue wavelength range, for example.

In addition to the active layer, the active semiconductor layer sequence can include other functional layers and functional areas, such as p- or n-doped charge carrier transport layers, so electron or hole transport layers, undoped or p- or n-doped confinement, cladding or waveguide layers, barrier layers, planarization layers, buffer layers, protective layers and/or electrodes as well as combinations thereof. Furthermore, one or more mirror layers can be deposited on a side of the semiconductor layer sequence facing away from the growth substrate. The structures described here, the active layer or the other functional layers and areas are known to the expert in particular with regard to structure, function and structure and are therefore not explained in detail here.

In one embodiment, the emitted primary radiation of the semiconductor chip or the active layer of the layer sequence lies in the blue region of the electromagnetic spectrum. In the blue region of the electromagnetic spectrum, this may mean that the emitted primary radiation has a peak wavelength between 420 nm and 480 nm inclusive, preferably between 430 nm and 460 nm inclusive, particularly preferably between 440 nm and 455 nm inclusive.

According to at least one embodiment, the semiconductor chip or the sequence of layers has a main radiation exit surface over which the conversion element is arranged.

The fact that a layer or element is arranged or applied "on top of" or "above" another layer or element may mean here and below that one layer or element is arranged or applied directly in mechanical and/or electrical contact with the other layer or element. Furthermore, it can also mean that one layer or element is arranged indirectly on or above the other layer or element. Further layers and/or elements can then be arranged between one or the other layer or between one or the other element.

The main radiation exit surface is a main surface of the semiconductor chip or the layer sequence. The main radiation exit surface extends in particular parallel to a main extension plane of the semiconductor layers of the layer sequence. For example, at least 51% or 90% of the primary radiation leaving the layer sequence emerges from the layer sequence via the main radiation exit surface.

In one embodiment, the conversion element has a direct mechanical contact to the semiconductor chip or the layer sequence, in particular to the main radiation exit surface.

In one embodiment, the conversion element is arranged over the entire surface of the semiconductor chip or layer sequence, in particular its main radiation exit surface.

In one embodiment, the conversion element comprises a matrix material. The converter materials can be distributed in the matrix material, for example, they are homogeneously or randomly distributed in the matrix material.

The matrix material is transparent to both primary and secondary radiation and is, for example, selected from a group of materials: Glasses, silicones, epoxy resins, polysilazanes, polymethacrylates and polycarbonates and combinations thereof. Transparent means that the matrix material is at least partially permeable for the primary radiation as well as for the secondary radiation.

According to at least one embodiment, the converter materials in the conversion element are homogeneously or randomly distributed.

In one embodiment, the converter materials are distributed in the conversion element with a concentration gradient.

According to at least one embodiment, the first converter material is subordinated to the second converter material in order to reduce absorption losses.

In one embodiment, the phosphors are particles of the corresponding phosphors.

The particles of the phosphors can independently of one another have an average grain size between 1 μm and 50 μm, preferably between 5 μm and 40 μm, particularly preferred between 8 μm and 35 μm. With these grain sizes, the primary or secondary radiation at these particles is advantageously scattered little or mainly in the forward direction, which reduces efficiency losses.

According to at least one embodiment, the conversion element consists of the converter materials and the matrix material.

According to at least one embodiment, the conversion element is configured as a platelet.

In one embodiment, the platelet has a thickness of 1 μm to 1 mm, preferably 10 μm to 300 μm, particularly preferred 25 μm to 200 μm.

The layer thickness of the entire platelet can be uniform. This allows a constant color location to be achieved over the entire surface of the platelet.

In one embodiment, the conversion element can be a ceramic platelet. This means that the platelet consists of sintered particles of the converter materials.

In one embodiment, the platelet comprises a matrix material, such as silicone, in which the converter materials are embedded. The platelet can also consist of the matrix material and the converter materials.

According to at least one embodiment, the conversion element is formed as a platelet arranged over the semiconductor chip or layer sequence.

The conversion element can be shaped as a platelet and attached directly to the semiconductor chip or the layer sequence. It is possible that the platelet completely covers the entire surface, in particular the main radiation exit surface of the semiconductor chip or the layer sequence.

The optoelectronic device may comprise a housing. In the middle of the housing may be a recess. The semiconductor chip can be mounted in the recess. It is also possible that one or more additional semiconductor chips are attached in the recess.

It is possible that the recess is filled with a potting covering the semiconductor chip or the layer sequence. However, the recess can also consist of an airspace.

In one embodiment, the conversion element is arranged above the recess of the housing. In this embodiment, there is no direct and/or positive contact between the conversion element and the semiconductor chip or the layer sequence, so there can be a distance between the conversion element and the semiconductor chip. In other words, the conversion element is subordinated to the semiconductor chip and is irradiated by the primary radiation. Between the conversion element and the semiconductor chip a potting or an air gap can be formed. This arrangement can also be called "Remote Phosphor Conversion".

In one embodiment, the conversion element is part of the potting of the semiconductor chip or the conversion element forms the potting.

In one embodiment, the conversion element is formed as a layer. The layer may be located over the main radiation exit surface of the semiconductor chip or over the main radiation exit surface and the side surfaces of the semiconductor chip.

According to at least one embodiment, the device comprises a second or more additional semiconductor chips.

According to at least one embodiment, the optoelectronic device is a light-emitting diode, or LED for short.

The specified embodiment of the optoelectronic device can be used for the following applications. All features of the optoelectronic device also apply to its use and vice versa.

In various embodiments the use of an optoelectronic device according to the above mentioned embodiments for backlighting a color filter system, in particular an LCD color filter system or a color filter system of a display is specified.

In one embodiment of the use, the color filter system is a color filter system for a computer monitor, television, tablet, or smartphone.

In one embodiment, the color filter system is a color filter system of the colors red, green and blue or red, green, blue and yellow.

In one embodiment, the color filter system has a transmission half-width in the range from 70 to 120 nm for the colors red, green, blue or red, green, blue and yellow.

In one embodiment, the emission of the optoelectronic device and the transmission of the color filter system are selected so that they lie at similar wavelengths. As a result, there is only little reabsorption on the color filter system.

The specified embodiment of the optoelectronic device may be part of a lighting unit for a television set, computer monitor, tablet or smartphone, for example. The features mentioned under the device also apply to the lighting unit and vice versa.

In further embodiments, a lighting unit comprises an optoelectronic device described here and a color filter system, in particular an LCD color filter system. The color filter system is usually used to form the subpixels of a lighting unit, such as a television, computer, tablet or smartphone, wherein the subpixels emit the colors blue, green, red and/or blue, green, yellow and red. The light source for the individual subpixels is the optoelectronic device. In other words, the secondary radiation or the secondary radiation and the primary radiation pass through the color filter system. The total electromagnetic radiation that passes through the filter system is called the radiation of a transmission spectrum.

BRIEF DESCRIPTION OF THE DRAWINGS

Further advantageous embodiments and developments of the invention result from the exemplary embodiments described in the following in connection with the figures.

DETAILED DESCRIPTION OF ILLUSTRATIVE EMBODIMENTS

Figure 1:
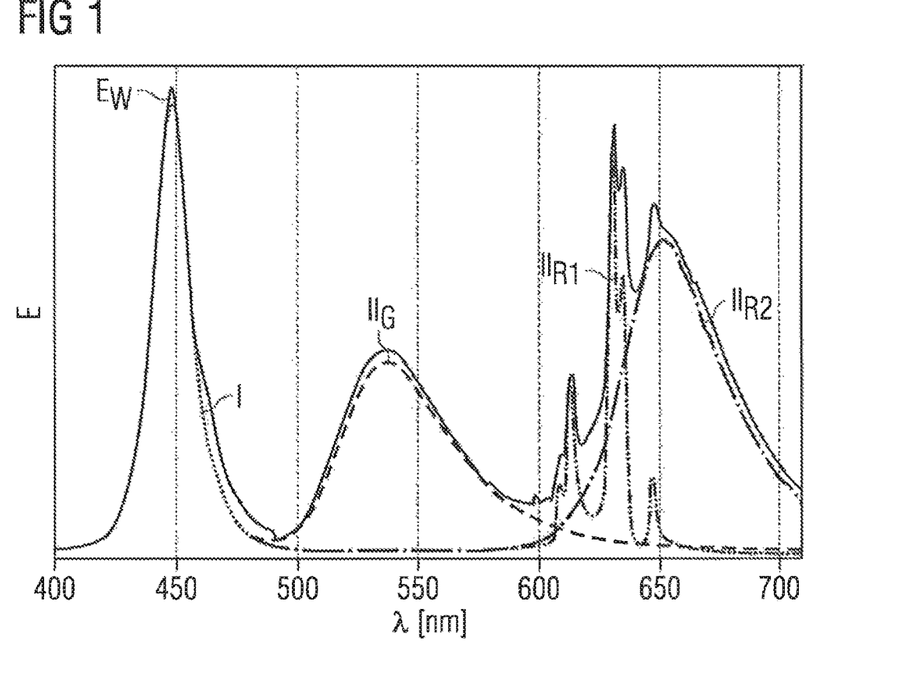
FIGS. 1 to 4 show emission spectra of various exemplary embodiments of optoelectronic devices.

FIG. 1 shows an emission spectrum of an exemplary embodiment of an optoelectronic device. On the x-axis the wavelength λ is plotted in nm and on the y-axis the emission E is plotted. Shown are the primary radiation I, the secondary radiation of the first converter material, a beta-SiAlON, in the green spectral range $II_G$, the secondary radiation of the first red phosphor $(K,Na)_2(Si,Ti)F_6:Mn^{4+}$ $II_{R1}$, and the second red phosphor $(Sr,Ca)_{1-x}Eu_{x'''}[LiAl_3N_4]$ with $0.001 \leq x''' \leq 0.2$ $II_{R2}$. The emission spectra I, $II_G$, $II_{R1}$ and $II_{R2}$ show a small half-width and a high overlap with the transmission range of a standard blue filter, a standard green filter or a standard red filter. In addition, the emission spectra I and $II_G$ or $II_G$ and $II_{R1}$ and $II_{R2}$ show hardly any overlap with each other, whereby a high color saturation of the individual colors can be achieved, since the individual emissions spectrally respond to only or almost only one color of a color filter system. Superimposed, I, $II_G$, $II_{R1}$ and $II_{R2}$ produce the white total radiation $E_W$. The color location of the white total radiation in the CIE color space (1931) is Cx=0.3263 and Cy=0.2917 and a correlated color temperature of 5896 K. By using the first red phosphor and the second red phosphor, a large color space can be covered with advantage. In addition, high brightness can be achieved because the dominant wavelength of the first red phosphor is closer to the maximum eye sensitivity at 555 nm compared to the second red phosphor, which means that the total secondary radiation emitted in the red spectral range has a higher overlap with the eye sensitivity curve. Due to the narrow-band emission of the second red phosphor with a half-width below 60 nm, there is no or only a small amount of radiation outside the visible spectral range, which increases the luminescence efficiency of the device.

The emission peaks of the first and second red phosphors show a very large overlap with the transmission range of a standard red filter, so that only little light is lost and the achievable color space is large. With the invention of the first red phosphor $(K,Na)_2(Si,Ti)F_6:Mn^{4+}$ and the second red phosphor $(Sr,Ca)_{1-x'''}Eu_{x'''}$-$[LiAl_3N_4]$ two essential aspects for backlighting applications can be fulfilled: a high brightness and the coverage of a large color space. In comparison, the use of $(Ca,Sr)AlSiN_3$:Eu as a second red phosphor has proven to be less suitable, since it emits too broadly with a half-width of 90 nm, resulting in luminescence losses.

Figure 2:
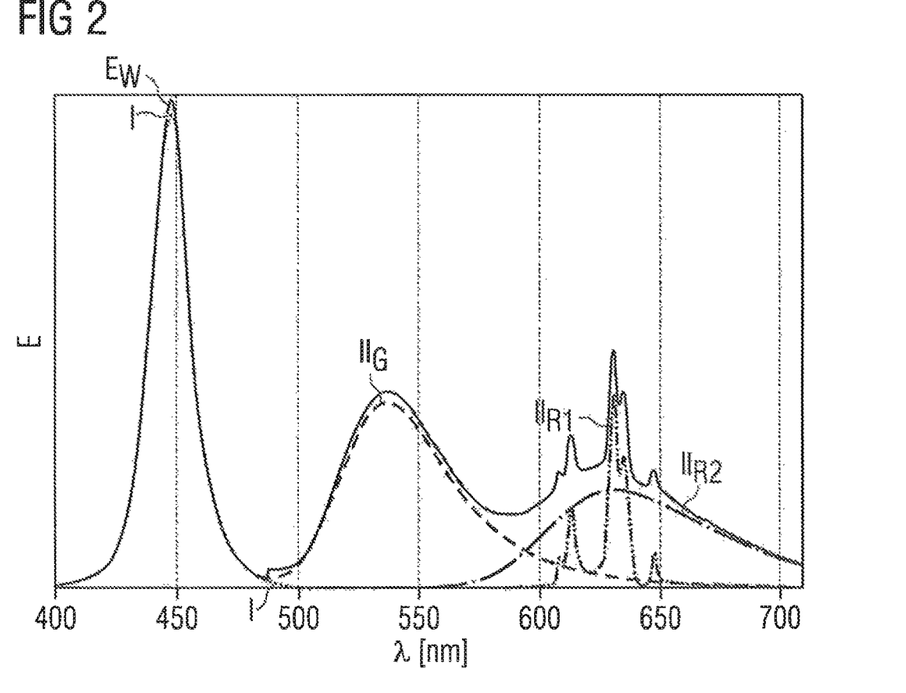

FIG. 2 shows an emission spectrum of an exemplary embodiment of an optoelectronic device. On the x-axis the wavelength λ is plotted in nm and on the y-axis the emission E is plotted. Shown are the primary radiation I, the secondary radiation of the first converter material, a beta-SiAlON, in the green spectral range $II_G$, the secondary radiation of the first red phosphor $(K,Na)_2(Si,Ti)F_6:Mn^{4+}$ $II_{R1}$ and the second red phosphor $[Sr(Sr_aCa_{1-a})]_{1-x}Eu_xSi_2Al_2N_6$ with $0.5 \leq a \leq 1$ and $0.001 \leq x \leq 0.2$ $II_{R2}$. The emission spectra I, $II_G$, $II_{R1}$ and $II_{R2}$ are very narrow-band and show a high overlap with the transmission range of a standard blue filter, a standard green filter or a standard red filter. In addition, the emissions I and $II_G$ and $II_G$ or and $II_G$ and $II_{R1}$ and $II_{R2}$ show hardly any overlap with each other, whereby a high color saturation of the individual colors can be achieved, since the individual emissions spectrally respond only or almost only one color of a color filter system. Superimposed, I, $II_G$, $II_{R1}$ and $II_{R2}$ produce the white total radiation Ew. The color location of the white total radiation in the CIE color space (1931) are Cx=0.3013 and Cy=0.2893 and a correlated color temperature of 7903 K. Due to the narrow-band emissions of the first and second red phosphors, there is little or no radiation outside the visible spectral range, which increases the device's luminescence efficiency. The emission peaks of the first and second red phosphor show a very large overlap with the transmission range of a standard red filter, so that only little light is lost and the achievable color space is large. In comparison, the use of $(Ca,Sr)AlSiN_3$:Eu as a second red phosphor has proven to be less suitable, as it emits too broadly with a half-width of 90 nm, resulting in luminescence losses.

Figure 3:
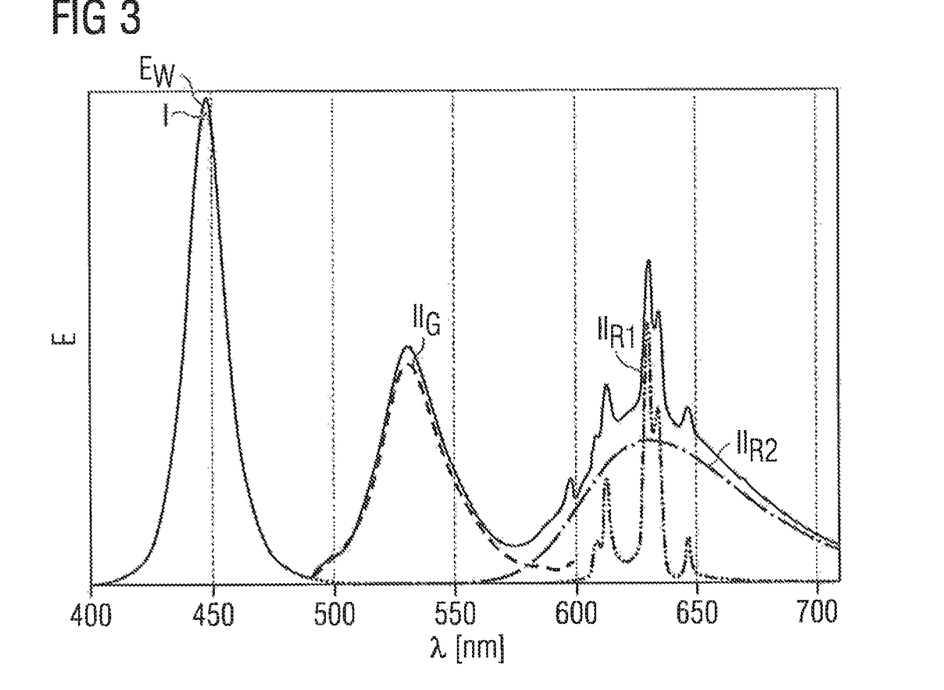

FIG. 3 shows an emission spectrum of an exemplary embodiment of an optoelectronic device. On the x-axis the wavelength λ is plotted in nm and on the y-axis the emission E is plotted. Shown are the primary radiation I, the secondary radiation of the first converter material, I, converter particles with a quantum structure with barrier layers and quantum layers arranged alternately in the green spectral range $II_G$, the secondary radiation of the first red phosphor $(K,Na)_2(Si,Ti)F_6:Mn^{4+}$ $II_{R1}$ and of the second red phosphor $[Sr(Sr_aCa_{1-a})]_{1-x}Eu_xSi_2Al_2N_6$ with $0.5 \leq a \leq 1$ and $0.001 \leq x \leq 0.2$ $II_{R2}$. The emissions I, $II_G$, $II_{R1}$ and $II_{R2}$ are very narrow-band and show a high overlap with the transmission range of a standard blue filter, a standard green filter or a standard red filter. In addition, the emissions I and $II_G$ or and $II_G$ and $II_{R1}$ and $II_{R2}$ show hardly any overlap with each other, whereby a high color saturation of the individual colors can be achieved, since the individual emissions spectrally respond only or almost only one color of a color filter system. Superimposed, I, $II_G$, $II_{R1}$, and $II_{R2}$ produce the white total radiation Ew. The color location of the white total radiation in the CIE color space (1931) is Cx=0.3138 and Cy=0.2722 and a correlated color temperature of 7167 K. Due to the narrow-band emissions of the first and second red phosphor, there is little or no radiation outside the visible spectral range, which increases the device's luminescence efficiency. The emission peaks of the first and second red phosphor advantageously show a very large overlap with the transmission range of a standard red filter, so that only little light is lost and the achievable color space is large. In comparison, the use of $(Ca,Sr)AlSiN_3$:Eu as a second red phosphor has proven to be less suitable, as it emits too broadly with a half-width of 90 nm, resulting in luminescence losses.

Figure 4:
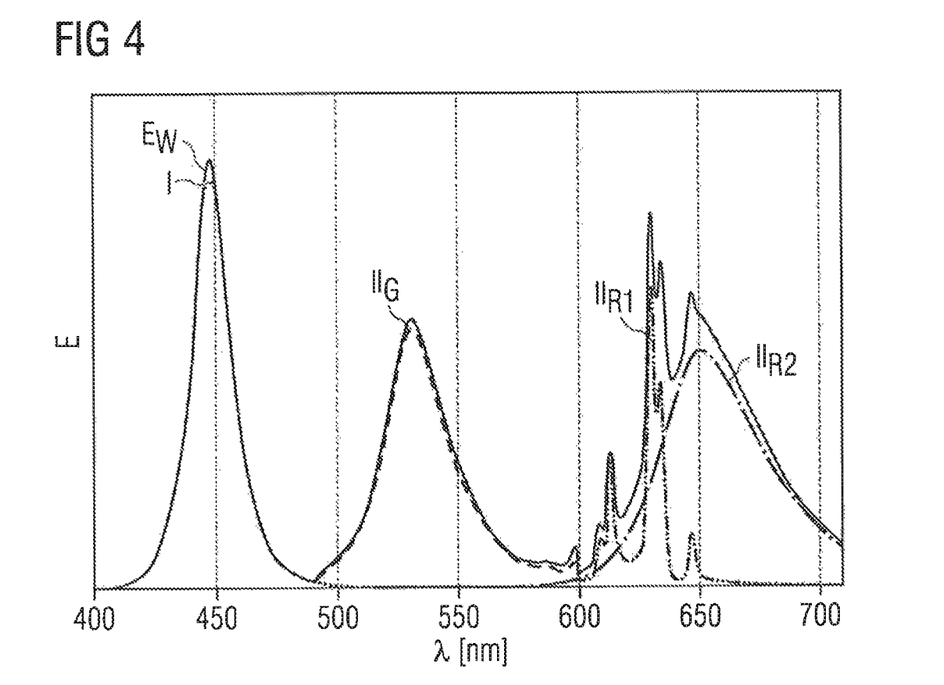

FIG. 4 shows an emission spectrum of an exemplary embodiment of an optoelectronic device. On the x-axis the wavelength λ is plotted in nm and on the y-axis the emission E is plotted. Shown are the primary radiation I, the secondary radiation of the first converter material, converter particles having a quantum structure with barrier layers and quantum layers arranged alternately in the green spectral region $II_G$, the secondary radiation of the first red phosphor $(K,Na)_2(Si,Ti)F_6:Mn^{4+}$ $II_{R1}$ and the second red phosphor $(Sr,Ca)_{1-x'''}Eu_{x'''}$[LiAl_3N_4]$ with $0.001 \leq x''' \leq 0.2$ $II_{R2}$. The emissions I, $II_G$, $II_{R1}$, and $II_{R2}$ are very narrowband and show a high overlap with the transmission range of a standard blue filter, a standard green filter or a standard red filter. In addition, the emissions I and $II_G$ or and $II_G$ and $II_{R1}$, and $II_{R2}$ show hardly any overlap with each other, whereby a high color saturation of the individual colors can be achieved, since the individual emissions spectrally respond only or almost only one color of a color filter system. Superimposed, I, $II_G$, $II_{R1}$ and $II_{R2}$ produce the white total radiation Ew. The color location of the white total radiation in the CIE color space (1931) is Cx=0.2954 and Cy=0.2929 and a correlated color temperature of 8318 K. By using the first red phosphor and the second red phosphor, it is advantageous to cover a large range of the red spectral range, thus covering a large color space. In addition, high brightness can be achieved because the dominant wavelength of the first red phosphor is closer to the maximum eye sensitivity at 555 nm compared to the second red phosphor, resulting in a higher overlap of the emitted secondary radiation with the eye sensitivity curve. Due to the narrow-band emission of the second red phosphor with a half-width below 60 nm, there is no or only a small amount of radiation outside the visible spectral range, which increases the luminescence efficiency of the device. The emission peaks of the first and second red phosphor show a very large overlap with the transmission range of a standard red filter, so that only little light is lost and the achievable color space is large. Thus, with the use of the first red phosphor $(K,Na)_2(Si,Ti)F_6:Mn^{4+}$ and the second red phosphor $(Sr,Ca)_{1-x'''}Eu_{x'''}$[LiAl_3N_4]$ in accordance with the invention, two essential aspects for backlighting applications can be fulfilled: maximum brightness and coverage of a large color space. In comparison, the use of $(Ca,Sr)AlSiN_3$:Eu as a second red phosphor has proven to be less suitable, as it emits too broadly with a half-width of 90 nm, resulting in luminescence losses.

Figure 5:
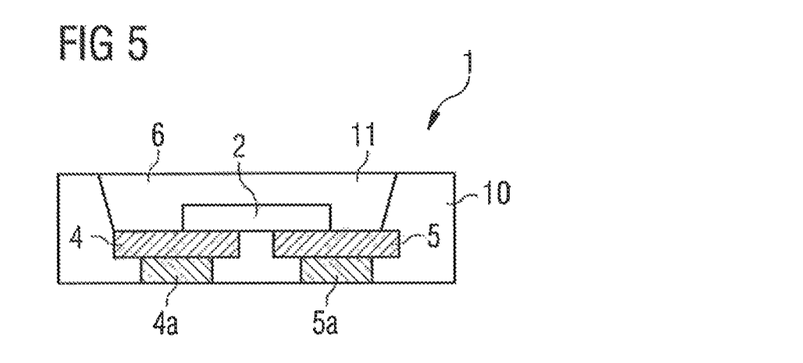
FIGS. 5 to 6 show schematic side views of various embodiments of optoelectronic devices.

The exemplary embodiment of an optoelectronic device 1 shown in FIG. 5 shows a semiconductor chip 2 that emits primary radiation in the blue region of the electromagnetic spectrum during operation of the device, for example, with a peak wavelength of 460 nm. The semiconductor chip is based on aluminum indium gallium nitride. The semiconductor chip 2 is mounted on a first connection 4 and a second connection 5 and electrically connected to these connections. The connections 4, 5 are electrically connected with through-connections 4a and 5a.

In the exemplary embodiment shown in FIG. 5, the first and second electrical connections 4, 5 are embedded in an opaque, e.g., prefabricated, housing 10 with a recess 11. Prefabricated means that the housing 10 is already formed at the connections 4 and 5, for example, by injection moulding, before the semiconductor chip 2 is mounted on the connections 4, 5. The housing, for example, comprises an opaque plastic and the recess 11 is configured as a reflector for the primary and secondary radiation, whereby the reflection can be realized by the housing material or by a suitable coating of the inner walls of the recess 11. The connections 4, 5 are made of a metal that has a reflectivity for blue primary radiation greater than 60%, preferably greater than 70%, particularly preferred greater than 80%, such as silver or gold.

The conversion element 6 in the exemplary embodiment of FIG. 5 is formed in the form of a potting and fills the recess 11, as shown in FIG. 5. The conversion element 6 comprises a silicone or an epoxy in which particles of a green phosphor, in this case a green beta-SiAlON phosphor, are embedded as the first converter material of formula and particles of a second converter material. The second converter material consists of a first phosphor of the formula $K_2SiF_6:Mn^{4+}$ and a second red phosphor of the formula $(Sr,Ca)_{1-x'''}Eu_{x'''}[LiAl_3N_4]$ with $0.001 \leq x''' \leq 0.2$. The particles of the beta-SiAlON phosphor partially convert the primary radiation to a secondary radiation in the green region of the electromagnetic spectrum and the second converter material partially convert the primary radiation to a secondary radiation in the red region of the electromagnetic spectrum. The superposition of the primary radiation and the secondary radiation in the green and red spectral range results in a white total radiation.

In this exemplary embodiment, the total radiation is radiated upwards via the conversion element 6. The total radiation preferably has a color temperature of 4000 K to 30000 K and is therefore preferably close to the Planck's radiation curve or close to the respective isotherms. In the CIE color diagram (1931), for example, the color location of the device are in the range from Cx 0.15-0.40 and Cy 0.15-0.40, preferably in the range from Cx 0.20-0.37 and Cy 0.20-0.37, for color locations, for example. The color location refers to points in or on a color body which is described in the color space with suitable coordinates in its position. The color location represents the color perceived by an observer.

Figure 6:
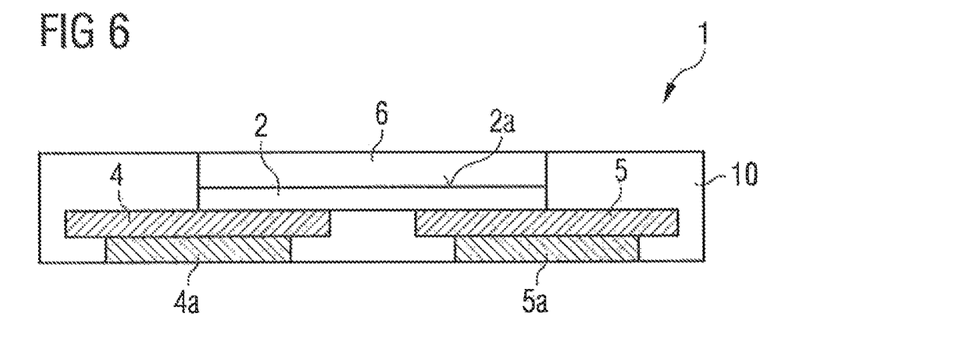

In the exemplary embodiment of an optoelectronic device 1 shown in FIG. 6, the conversion element 6, in contrast to the device in FIG. 5, is formed as a layer which is arranged above the semiconductor chip 2. The layer is arranged above the main radiation exit surface of the semiconductor chip. It is possible that the layer also covers the side walls of the semiconductor chip (not shown here).

The invention is not limited by the description with reference to the exemplary embodiments. Rather, the invention includes each new feature as well as each combination of features, which in particular includes each combination of features in the patent claims, even if that feature or combination itself is not explicitly mentioned in the patent claims or exemplary embodiment.

The invention claimed is:

1. An optoelectronic device comprising:
a semiconductor chip configured to emit primary radiation having a peak wavelength between 420 nm inclusive and 480 nm inclusive; and
a conversion element comprising:
a first converter material configured to partially convert the primary radiation into secondary radiation in a green range of the electromagnetic spectrum; and
a second converter material configured to partially convert the primary radiation into a secondary radiation in a red region of the electromagnetic spectrum,
wherein the second converter material comprising a first red phosphor of the formula $(K,Na)_2(Si,Ti)F_6:Mn^{4+}$ and a second red phosphor selected from the following formula:
$(M')_{2-x'}Eu_{x'}Si_2Al_2N_6$ where M'=Sr, Ca, Ba, and/or Mg and $0.001 \leq x' \leq 0.2$,
wherein the second red phosphor of the formula $(M')_{2-x}Eu_xSi_2Al_2N_6$ comprises:
$[Sr(Sr_aM_{1-a})]_{1-x}Eu_xSi_2Al_2N_6$, where M=Ca, Ba, Zn and/or Mg, $0.5 \leq a \leq 1$ and $0.001 \leq X \leq 0.2$,
$(M'')_{1-x''}Eu_{x''}AlSiN_3*Si_2N_2O$, where M''=Sr, Ca, Ba, and/or Mg and $0.001 \leq x'' \leq 0.2$,
or
$(M''')_{1-x'''}Eu_{x'''}[LiAl_3N_4]$ with M'''=Sr, Ca, Ba, and/or Mg and $0.001 \leq x''' \leq 0.2$, and
wherein the optoelectronic device is configured to emit white total radiation.

2. The optoelectronic device according to claim 1, wherein the second red phosphor comprises the formula:
$[Sr(Sr_aM_{1-a})]_{1-x}Eu_xSi_2Al_2N_6$, where M=Ca, Ba, Zn, and/or Mg with $0.5 \leq a \leq 1$ and $0.001 \leq x \leq 0.2$.

3. The optoelectronic device according to claim 1, wherein the first converter material comprises converter particles having a quantum structure with barrier layers and quantum layers or a green phosphor.

4. The optoelectronic device according to claim 3, wherein the first converter material comprises the converter particles having the quantum structure with the barrier layers and the quantum layers, and wherein the barrier layers and the quantum layers are arranged alternately.

5. The optoelectronic device according to claim 3, wherein the first converter material comprises the green phosphor selected from the group consisting of orthosilicates, nitridoorthosilicates, beta-SiAlON and garnets.

6. The optoelectronic device according to claim 5, wherein the first converter material comprises a green orthosilicate phosphor of the formula
$(AE)_{2-y}Eu_ySiO_4$ where AE=Sr, Ca, Ba and/or Mg and $0.001 \leq y \leq 0.2$.

7. The optoelectronic device according to claim 5, wherein the first converter material comprises a green nitridoorthosilicate phosphor of the formula
$(AE)_{2-b-y'}(RE)_bEu_{y'}SiO_{4-b}N_b$,
wherein AE=Sr, Ba, Ca and/or Mg, RE=Rare earth metals, $0.002 \leq y' \leq 0.4$, $0 \leq b < 2-y'$, or
$(AE')_{2-c-y''}(RE')_xEu_{y''}Si_{1-d}O_{4-c-2d}N_c$ where AE'=Sr, Ba, Ca and/or Mg, RE'=Rare Earth Metals, $0.002 \leq y'' \leq 0.4$, $0 \leq c \leq 2-y''$ and $0 \leq d < 1$.

8. The optoelectronic device according to claim 5, wherein the first converter material comprises a green beta-SiAlON phosphor of the formula
$Si_{6-z-2y'''}Eu_{y'''}Al_zO_zN_{8-z}$ with $0 \leq z \leq 6$ and $0.001 \leq y''' \leq 0.2$.

9. The optoelectronic device according to claim 5, wherein the first converter material comprises a green garnet phosphor of the formula $(Lu,Y,Gd,Tb)_{3-y''''}Ce_{y''''}(Al,Ga)_5O_{12}$ with $0.003 \leq y'''' \leq 0.6$.

10. The optoelectronic device according to claim 1, wherein the conversion element is part of a potting of the semiconductor chip or the conversion element forms the potting.

11. The optoelectronic device according to claim 1, wherein the conversion element is formed as a layer and is disposed directly on the semiconductor chip.

12. The optoelectronic device according to claim 1, wherein the second red phosphor comprises the formula:
$[Sr(Sr_aCa_{1-a})]_{1-x}Eu_xSi_2Al_2N_6$ with $0.8 \leq a \leq 1$ and $0.001 \leq x \leq 0.2$.

13. A backlighting color filter system comprising:
the optoelectronic device according to claim 1.

14. A lighting unit comprising:
the optoelectronic device according to claim 1; and
a color filter system comprising a blue filter, a green filter and a red filter configured to filter the white total radiation of the optoelectronic device to radiation of a transmission spectrum.

15. An optoelectronic device comprising:
a semiconductor chip configured to emit primary radiation having a peak wavelength between 420 nm inclusive and 480 nm inclusive; and
a conversion element comprising:
a first converter material configured to partially convert the primary radiation into secondary radiation in a green range of the electromagnetic spectrum, wherein the first converter material comprises converter particles having a quantum structure with barrier layers and quantum layers or a green phosphor; and
a second converter material configured to partially convert the primary radiation into a secondary radiation in a red region of the electromagnetic spectrum,
wherein the second converter material comprising a first red phosphor of the formula $(K,Na)_2(Si,Ti)F_6$:$Mn^{4+}$ and a second red phosphor selected from the following formula:
$(M')_{2-x'}Eu_{x'}Si_2Al_2N_6$ where M'=Sr, Ca, Ba, and/or Mg and $0.001 \leq x' \leq 0.2$,
wherein the second red phosphor of the formula $(M')_{2-x'}Eu_{x'}Si_2Al_2N_6$ comprises:

$[Sr(Sr_aM_{1-a})]_{1-x}Eu_xSi_2Al_2N_6$, where M=Ca, Ba, Zn and/or Mg, $0.5 \leq a \leq 1$ and $0.001 \leq x \leq 0.2$,
$(M'')_{1-x''}Eu_{x''}AlSiN_3*Si_2N_2O$, where M''=Sr, Ca, Ba, and/or Mg and $0.001 \leq x'' \leq 0.2$,
$(M''')_{2-2x'''}Eu_{2x'''}Si_5N_8$, where M'''=Sr, Ca, Ba, and/or Mg and $0.001 \leq x''' \leq 0.2$,
or
$(M'''')_{1-x''''}Eu_{x''''}$-$[LiAl_3N_4]$ with M''''=Sr, Ca, Ba, and/or Mg and $0.001 \leq x'''' \leq 0.2$, and
wherein the optoelectronic device is configured to emit white total radiation.

16. The optoelectronic device according to claim 15, wherein the conversion element is part of a potting of the semiconductor chip or the conversion element forms the potting.

17. The optoelectronic device according to claim 15, wherein the conversion element is formed as a layer and is disposed directly on the semiconductor chip.

18. An optoelectronic device comprising:
a semiconductor chip configured to emit primary radiation having a peak wavelength between 420 nm inclusive and 480 nm inclusive; and
a conversion element comprising:
a first converter material configured to partially convert the primary radiation into secondary radiation in a green range of the electromagnetic spectrum, and
a second converter material configured to partially convert the primary radiation into a secondary radiation in a red region of the electromagnetic spectrum,
wherein the second converter material comprising a first red phosphor of the formula $(K,Na)_2(Si,Ti)F_6$: $Mn^{4+}$ and a second red phosphor comprising the formula:
$[Sr(Sr_aM_{1-a})]_{1-x}Eu_xSi_2Al_2N_6$, where M=Ca, Ba, Zn, and/or Mg with $0.5 \leq a \leq 1$ and $0.001 \leq x \leq 0.2$, and
wherein the optoelectronic device is configured to emit white total radiation.

19. The optoelectronic device according to claim 18, wherein the conversion element is part of a potting of the semiconductor chip or the conversion element forms the potting.

20. The optoelectronic device according to claim 18, wherein the conversion element is formed as a layer and is disposed directly on the semiconductor chip.

* * * * *

UNITED STATES PATENT AND TRADEMARK OFFICE
CERTIFICATE OF CORRECTION

PATENT NO. : 10,910,527 B2  
APPLICATION NO. : 16/349241  
DATED : February 2, 2021  
INVENTOR(S) : Pust Page 1 of 1

It is certified that error appears in the above-identified patent and that said Letters Patent is hereby corrected as shown below:

In the Claims

In Column 14, Line 17, Claim 1, delete "$(M')_{2-x'}Eu_{x'},Si_2Al_2N_6$" and insert --$(M')_{2-x'}Eu_{x'}Si_2Al_2N_6$--.

In Column 14, Line 22, Claim 1, delete "$0.001 \leq X \leq 0.2$" and insert --$0.001 \leq x \leq 0.2$--.

In Column 14, Line 26, Claim 1, delete "$(M'''')_{1-x''''}Eu_{x''''}-[LiAl_3N_4]$ with $M'''' = $ Sr, Ca, Ba" and insert --$(M'''')_{1-x''''}Eu_{x''''}[LiAl_3N_4]$ with $M'''' = $ Sr, Ca, Ba--.

In Column 16, Line 3, Claim 15, delete "$(M'')_{1-x''}Eu_{x'}AlSiN_3*Si_2N_2O$" and insert --$(M'')_{1-x''}Eu_{x''}AlSiN_3*Si_2N_2O$--.

In Column 16, Line 8, Claim 15, delete "$(M'''')_{1-x''''}Eu_{x''''}-[LiAl_3N_4]$" and insert --$(M'''')_{1-x''''}Eu_{x''''}[LiAl_3N_4]$--.

Signed and Sealed this  
Eleventh Day of May, 2021

Drew Hirshfeld  
*Performing the Functions and Duties of the*  
*Under Secretary of Commerce for Intellectual Property and*  
*Director of the United States Patent and Trademark Office*